(12) United States Patent
Chen et al.

(10) Patent No.: US 11,295,971 B2
(45) Date of Patent: Apr. 5, 2022

(54) ADSORPTION DEVICE COMPRISING A MAGNETIC PLATE HAVING OPPOSITE MAGNETIC POLES, TRANSFERRING SYSTEM HAVING SAME

(71) Applicant: Century Technology (Shenzhen) Corporation Limited, Shenzhen (CN)

(72) Inventors: Po-Liang Chen, New Taipei (TW); Yung-Fu Lin, New Taipei (TW); Hirohisa Tanaka, Neihu (TW); Yasunori Shimada, Neihu (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 125 days.

(21) Appl. No.: 16/547,854

(22) Filed: Aug. 22, 2019

(65) Prior Publication Data
US 2021/0005489 A1 Jan. 7, 2021

(30) Foreign Application Priority Data
Jul. 5, 2019 (CN) .......................... 201910604687.2

(51) Int. Cl.
*H01L 21/673* (2006.01)
*B65G 47/92* (2006.01)
*H01L 33/00* (2010.01)

(52) U.S. Cl.
CPC ........ *H01L 21/67336* (2013.01); *B65G 47/92* (2013.01); *H01L 33/00* (2013.01)

(58) Field of Classification Search
CPC ........ H01G 4/012; H01G 4/10; H01G 4/1227; H01G 4/1236; H01G 4/1245; H01G 4/232; H01G 4/30
See application file for complete search history.

(56) References Cited

U.S. PATENT DOCUMENTS

| 6,919,581 | B2 * | 7/2005 | Natori | G09F 9/33 257/13 |
| 7,929,133 | B2 * | 4/2011 | Wang | G01N 21/658 356/301 |
| 2002/0043923 | A1 * | 4/2002 | Natori | G09G 3/32 313/495 |
| 2006/0093863 | A1 * | 5/2006 | Tsuchiya | G11B 5/855 428/827 |
| 2013/0210194 | A1 | 8/2013 | Bibl et al. | |
| 2021/0005489 | A1 * | 1/2021 | Chen | H01L 25/0753 |
| 2021/0005490 | A1 * | 1/2021 | Chen | H01L 33/00 |

FOREIGN PATENT DOCUMENTS

| CN | 104115266 A | 10/2014 |
| CN | 105789122 A | 7/2016 |
| CN | 109378370 A | 2/2019 |

* cited by examiner

*Primary Examiner* — Minh N Trinh
(74) *Attorney, Agent, or Firm* — ScienBiziP, P.C.

(57) ABSTRACT

An adsorption device includes a magnetic plate and a limiting layer. A surface of the magnetic plate includes a first region and a plurality of second regions spaced apart from each other. The first region and each second region do not overlap with each other. The first region forms a magnetic pole of the magnetic plate, and each second region forms the opposite magnetic pole of the magnetic plate. The limiting layer covers the first region. Each second region is exposed to the limiting layer and configured for adsorbing a small-scale LED as a target object.

10 Claims, 7 Drawing Sheets

ADSORPTION DEVICE COMPRISING A MAGNETIC PLATE HAVING OPPOSITE MAGNETIC POLES, TRANSFERRING SYSTEM HAVING SAME

FIELD

The subject matter herein generally relates to a field of manufacturing display panel, and particularly relates to an adsorption device, a transferring system having the adsorption device, and a transferring method using the adsorption device.

BACKGROUND

In a manufacturing process of a micro light emitting diode (LED) display device, a large number of LEDs are transferred to a substrate having a circuit. A known method of transferring is to adopt electrostatic attraction, that is, the LEDs to be transferred are held to a transferring substrate by static electricity, then the transferring substrate with the LEDs is moved above the substrate, and the static electricity is removed to make the LEDs drop onto the substrate. However, the electrostatic charge may damage the circuit on the substrate.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
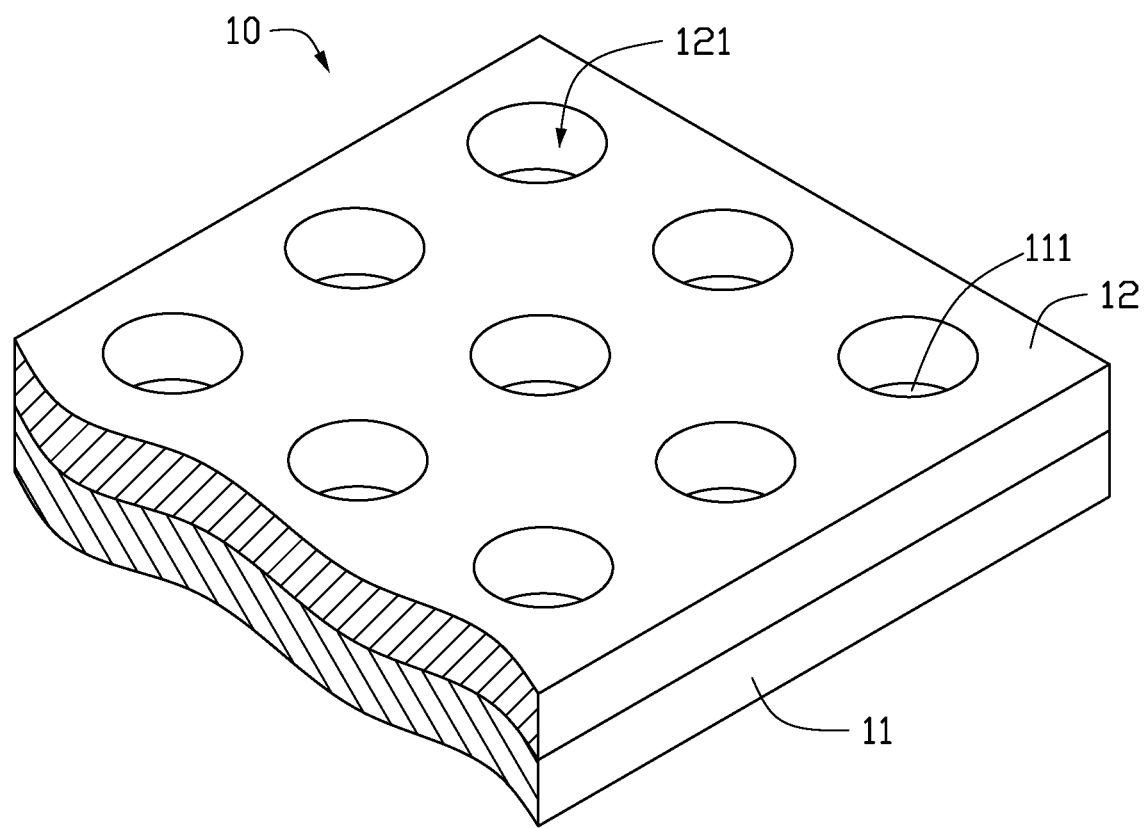
FIG. 1 is an isometric view of an adsorption device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

An adsorption device provided in this embodiment is configured for adsorbing target objects by magnetic force, and the adsorption device is particularly suitable for adsorbing target objects having a small size (micrometer level).

As shown in FIG. 1, the adsorption device 10 includes a magnetic plate 11 and a limiting layer 12 on a surface 111 of the magnetic plate 11. The limiting layer 12 partially covers the surface 111. The magnetic plate 11 has magnetic properties to generate magnetic force, and a portion of the surface 111 not covered by the limiting layer 12 is used for magnetically adsorbing target objects (not shown).

Figure 2:
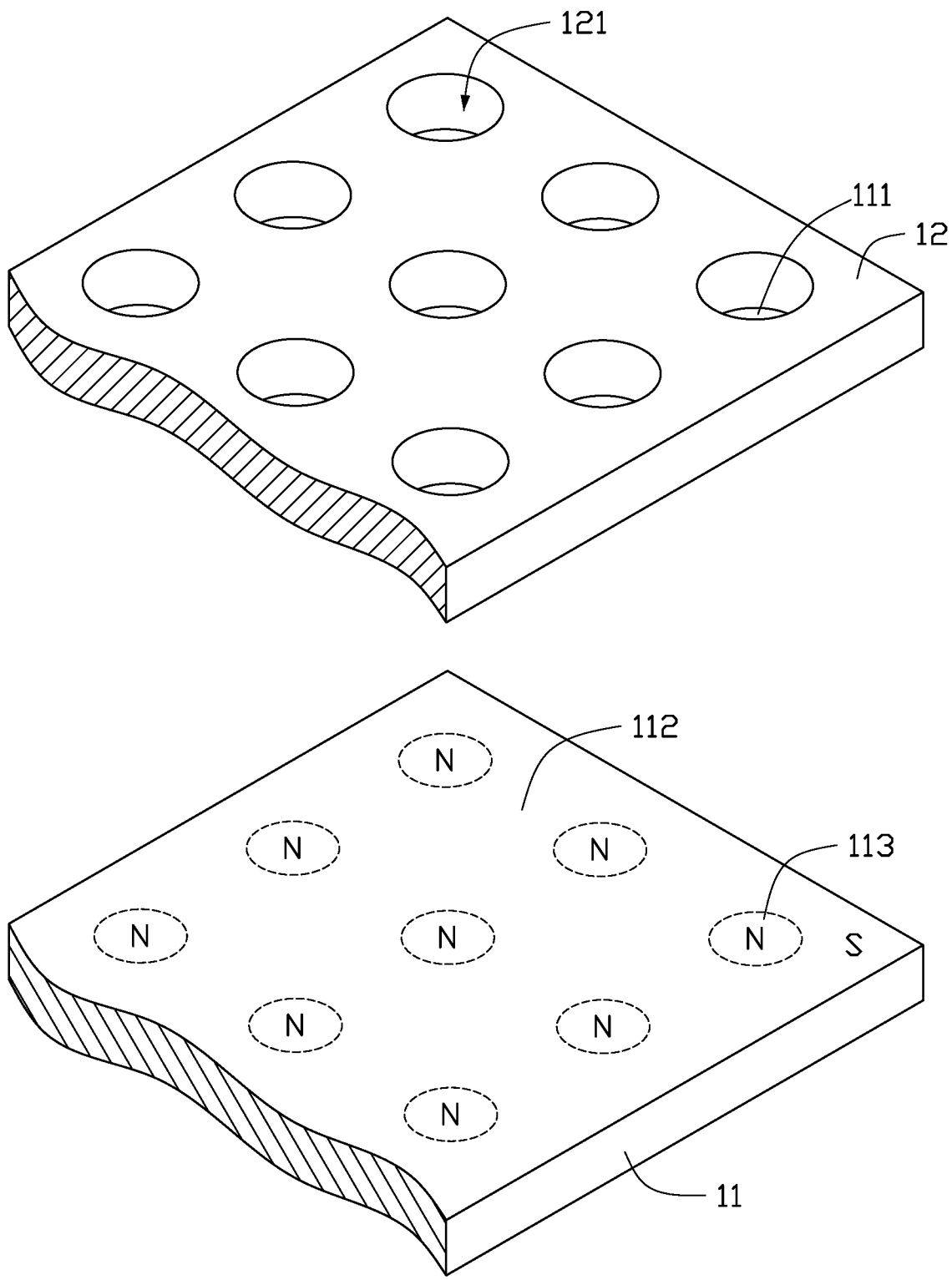
FIG. 2 is an exploded view of the adsorption device of FIG. 1.

As shown in FIG. 2, the surface 111 of the magnetic plate 11 includes a first region 112 and a plurality of second regions 113 spaced apart from each other. The first region 112 and each of the second regions 113 are independent of each other and do not overlap with each other. The first region 112 surrounds each second region 113. The first region 112 corresponds to a magnetic pole (for example magnetic pole S) of the magnetic plate 11, and each of the second regions 113 corresponds to the opposite magnetic pole (for example magnetic pole N) of the magnetic plate 11. In this embodiment, the first region 112 forms the magnetic pole S of the magnetic plate 11, and each of the second regions 113 forms the magnetic pole N of the magnetic plate 11. In other embodiments, the first region 112 forms the magnetic pole N of the magnetic plate 11, and each of the second regions 113 forms the magnetic pole S of the magnetic plate 11.

As shown in FIG. 2, the first region 112 and the second regions 113 are spliced together to form a continuous surface 111 of the magnetic plate 11. In this embodiment, each of the second regions 113 has a same shape and a same size, and the continuous surface 111 is rectangular, and the second regions 113 are arranged in an array. It should be understood that, the shape, size, and arrangement of the first region 112 and the second regions 113 are not limited as shown in FIG. 2 and can be adjusted.

As shown in FIG. 2, the limiting layer 12 is made of nonmagnetic material and is not easily magnetized by an external magnetic field. The limiting layer 12 covers the first region 112, and each of the second regions 113 is exposed from the limiting layer 12. In this embodiment, the limiting layer 12 defines a plurality of through holes 121, and each of the through holes 121 corresponds to and aligns with one of the second regions 113. Each second region 113 is exposed by one through hole 121. Since the second regions 113 are arranged in an array, the through holes 121 are also arranged in an array. Each second region 113 is for adsorbing a target object (not shown). Specifically, each second region 113 can independently adsorb a target object. When each second region 113 adsorbs the target object, the target object is located in the through hole 121. Therefore, the target objects can be attracted to an accurate and specific position on the magnetic plate 11 by the through holes 121 in the limiting layer 12.

Each second region 113 magnetically adsorbs one target object, and the target object has magnetic properties, and the target object can be magnetically attracted by the second region 113 of the magnetic plate 11. The target object has a magnetic pole that is attracted by the second region 113. That is, the magnetic pole of the target object and the magnetic pole of the second region 113 are opposite, and the magnetic pole of the target object and the magnetic pole of the first region 112 are the same. In the present embodiment, each through hole 121 corresponds to a second region 113 on the surface 111 of the magnetic plate 11 and a portion of the first region 112 at an edge of the second region 113. The second region 113 adsorbs the target object, and the first region 112 repels the target object. Therefore, the through hole 121 has a cross-sectional area not greater than an area of the second region 113 to ensure that the adsorption force is just sufficient to attract and hold the target object. In a modified embodiment of the present invention, the limiting layer 12 entirely covers the first region 112, and each through hole 121 corresponds to and covers only one second region 113.

In the adsorption device 10, the second regions 113 of the magnetic plate 11 are exposed to the limiting layer 12, and each second region 113 adsorbs the target object by magnetic force. The first region 112 cannot absorb the target object, so the adsorption device 10 ensures that the target objects are adsorbed only at specific positions (the second regions 113). Since multiple second regions 113 are defined on the surface 111 of the magnetic plate 11, the single adsorption operation of the adsorption device 10 can simultaneously adsorb multiple target objects, which improves adsorption efficiency.

Figure 3:
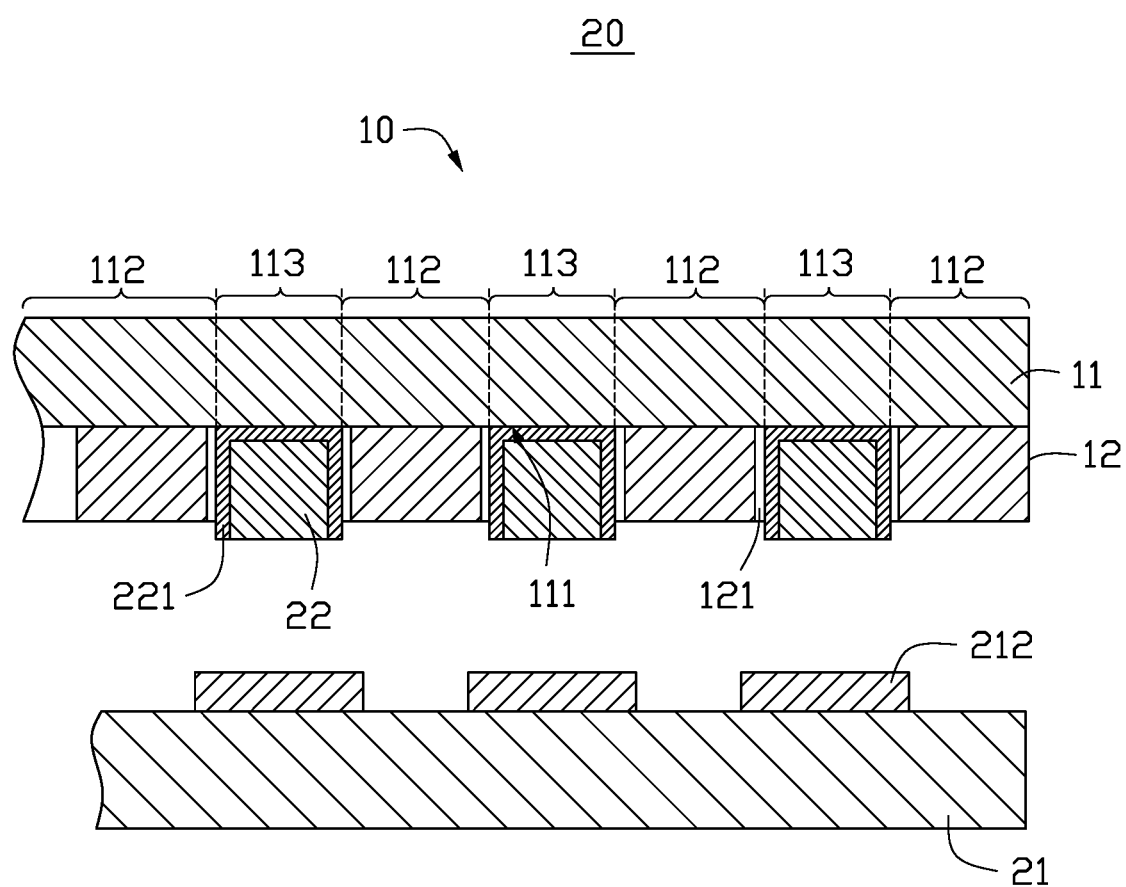
FIG. 3 is a cross-sectional view of a transferring system according to an embodiment of the present disclosure.

As shown in FIG. 3, a transferring system 20 includes the adsorption device 10 and a target substrate 21. In this embodiment, the transferring system 20 is used to complete the transfer of a large number of LEDs 22 during a manufacturing process of the display panel. The transferring system 20 is used to simultaneously transfer many LEDs 22 in a single transferring operation. In a manufacturing process of the display panel, the adsorption device 10 can adsorb tens of thousands of LEDs 42.

Figure 4:
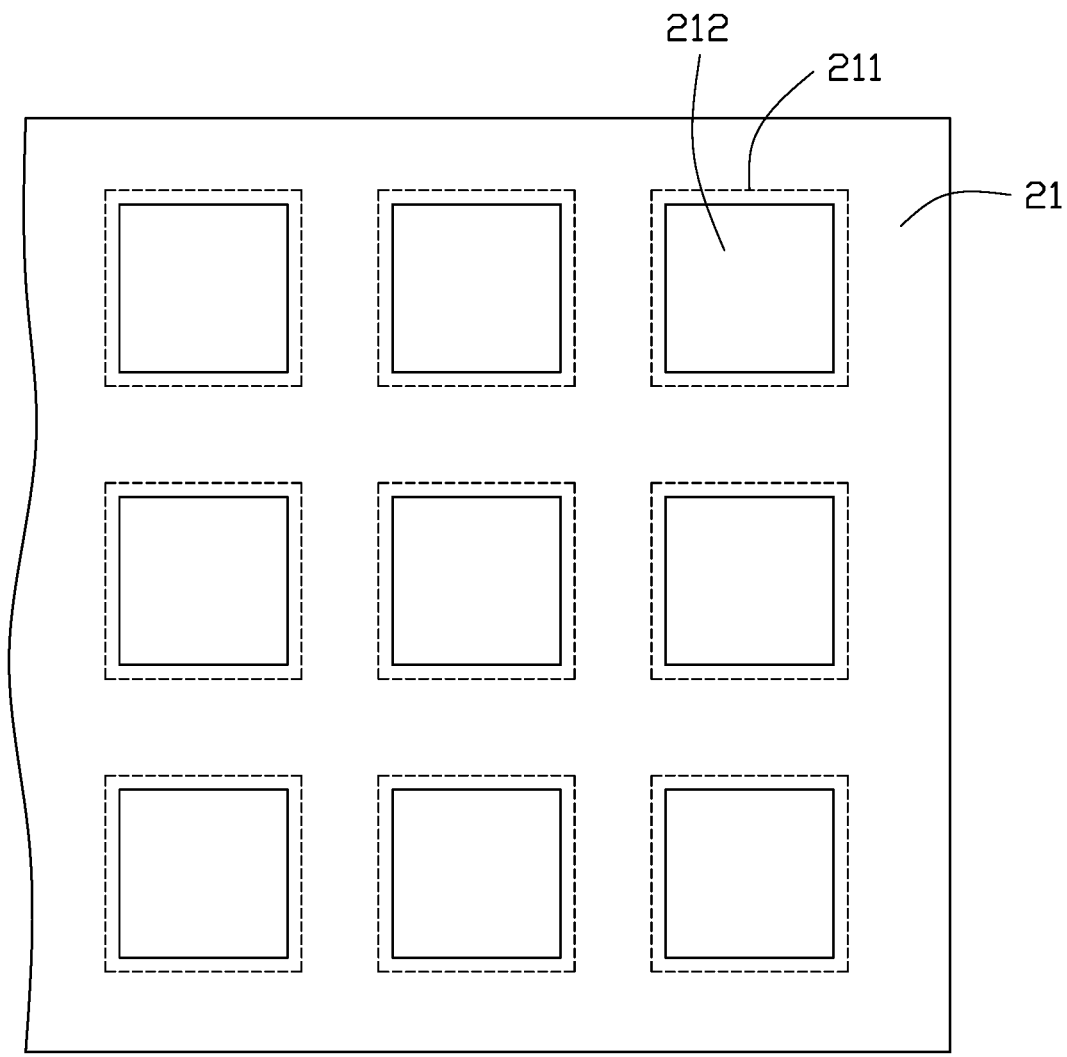
FIG. 4 is a plan view showing the transferring system of FIG. 3 in a working state.

In this embodiment, the target substrate 21 is an active substrate/array substrate of a display panel. As shown in FIG. 4, the target substrate 21 defines a plurality of pixel regions 211. During an operation of the transferring system 20, the pixel regions 211 correspond to portions of the surface 111 of the magnetic plate 11 that are not covered by the limiting layer 12. Each through hole 111 and each second region 113 correspond to and align with one of the pixel regions 211. Specifically, the pixel regions 211 are arranged in an array, and the second regions 113 are also arranged in an array. The pixel regions 211 are in one-to-one correspondence with the second regions 113. A plurality of spots of anisotropic conductive adhesive 212 is positioned on the target substrate 21, and each spot of anisotropic conductive adhesive 212 is located in one pixel region 211. Thus, the spots of anisotropic conductive adhesive 212 are also arranged in an array.

The LED 22 can be, for example, a mini LED, a micro LED, and a conventional size LED. The mini LED described herein refers to a sub-millimeter LED having a size of about 100 µm to 200 µm or more, a micro LED refers to an LED having a size of 100 µm or less. As shown in FIG. 3, the LED 22 is covered with a magnetic layer 221, and the magnetic layer 221 partially covers the LED 22. Specifically, the magnetic layer 221 is made of invar alloy, which is magnetized and coated on the surface of the LED 22 so that the LED 22 can be attracted and held by the adsorption device 10.

Figure 5:
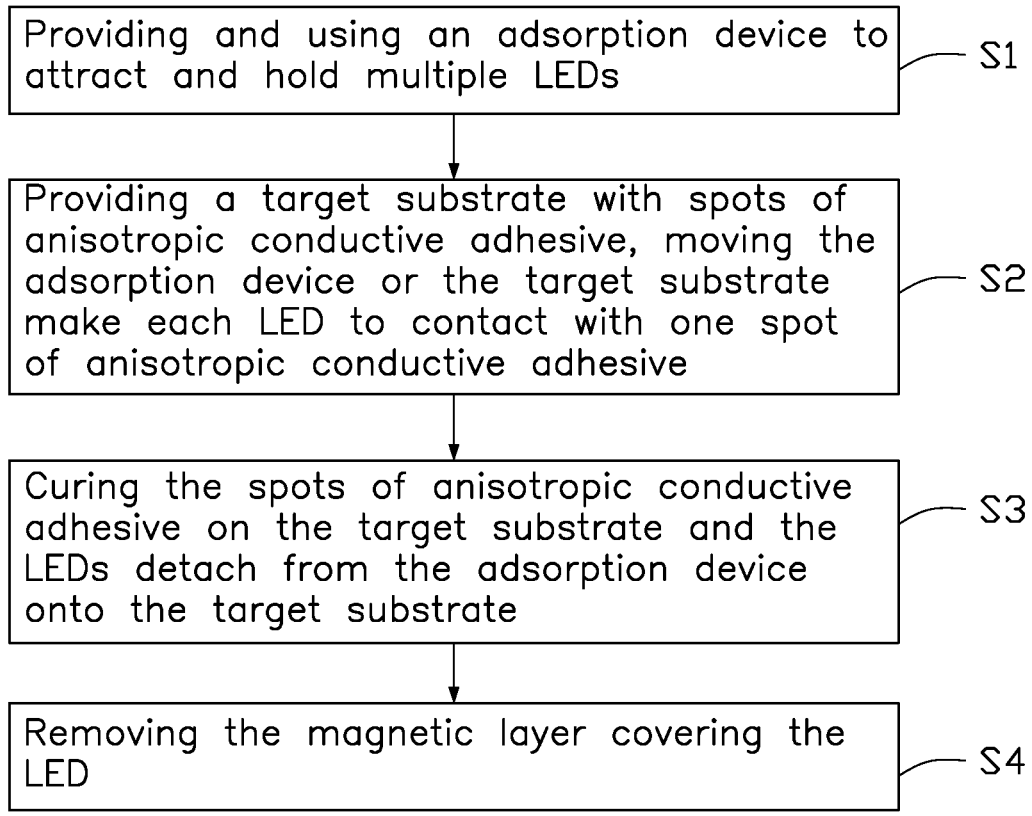
FIG. 5 is a flowchart showing a transferring method using the adsorption device.

FIG. 5 illustrates a flowchart of a transferring method using the transferring system 20. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block S1 according to the present disclosure. Depending on the embodiment, additional steps can be added, others removed, and the ordering of the steps can be changed.

At block S1, the above described adsorption device is provided and adsorb multiple LEDs.

As shown in FIG. 3, the adsorption device 10 has the magnetic plate 11 and the limiting layer 12. The limiting layer 12 defines the through holes 121 to expose the second regions 113 of the magnetic plate 11. Each LED 22 is partially covered by a magnetic layer 221, and the LED 22 can be adsorbed by the adsorption device 10. Each second region 113 adsorbs one LED 22, and each LED 22 adsorbed is received in one through hole 121. Each LED 22 in the through hole 121 has a surface away from the magnetic plate 11 that is not covered by the magnetic layer 221.

At block S2, a target substrate with a plurality of spots of anisotropic conductive adhesive on a surface thereof is provided, the adsorption device or the target substrate is moved to put each LED adsorbed by the adsorption device in contact with one spot of anisotropic conductive adhesive.

Figure 6:
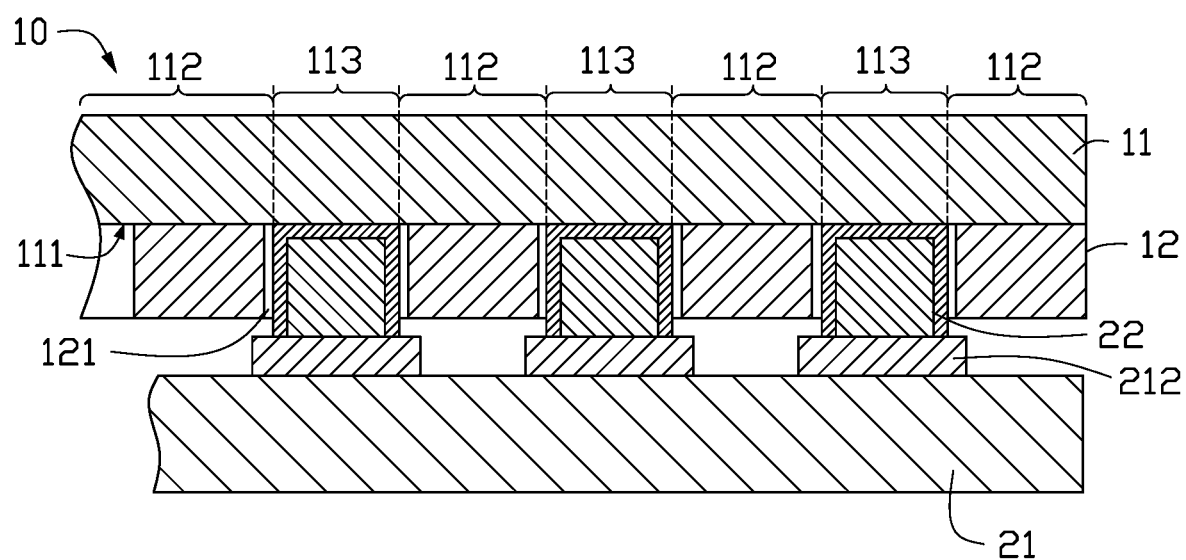
FIG. 6 is a cross-sectional view showing the transferring system in a working state.

As shown in FIG. 6, the adsorption device 10 is moved above the target substrate 21 or the target substrate 21 is moved under the adsorption device 10, and the LEDs 22 adsorbed by the adsorption device 10 are in one-to-one correspondence with the spots of anisotropic conductive adhesive 212 on the target substrate 21. Each LED 22 makes contact with one spot of anisotropic conductive adhesive 212.

At block S3, the anisotropic conductive adhesive on the target substrate is cured, and the adsorption device is moved away. The multiple LEDs detach from the adsorption device to the target substrate when the adsorption device is removed.

Figure 7:
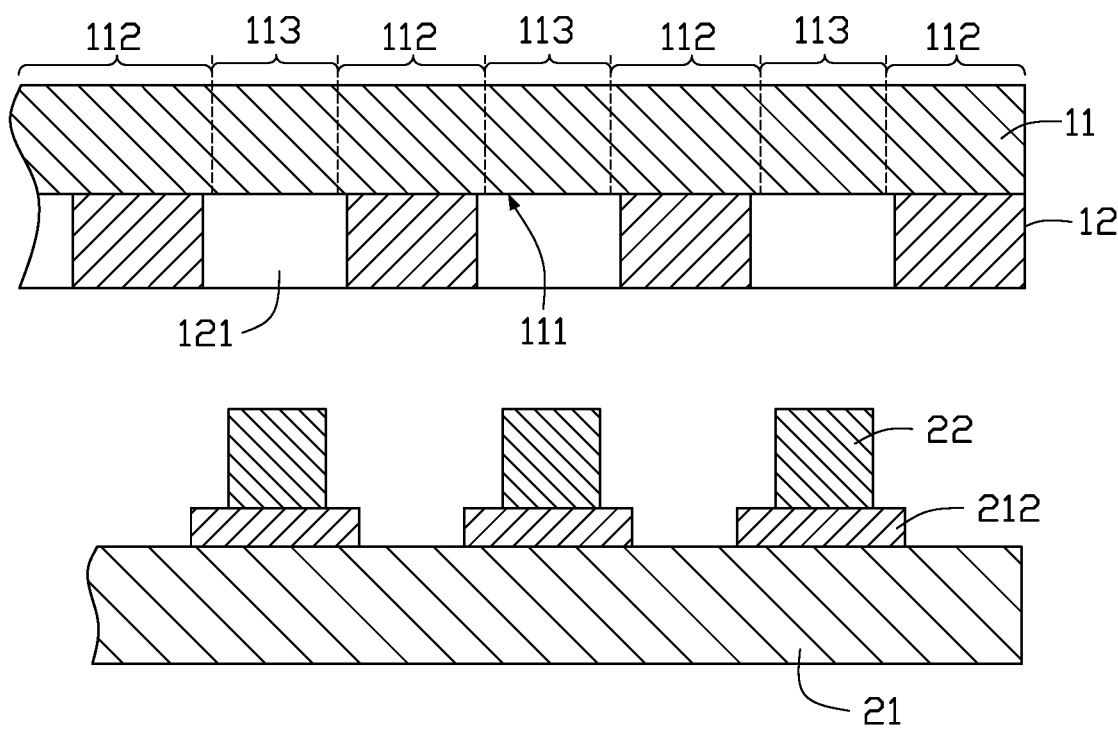
FIG. 7 is cross-sectional view showing the transferring system in another working state.

The anisotropic conductive adhesive 212 is thermally cured or UV-cured so that the LEDs 22 are adhered to the spots of anisotropic conductive adhesive 212 in one-to-one correspondence. As shown in FIG. 7, an adhesion force between the LED 22 and the anisotropic conductive adhesive 212 is greater than the magnetic attraction of the LED 22 to the adsorption device 10. When the adsorption device 10 is moved away from the target substrate 21, the LED 22 separates from the adsorption device 10 and remains fixed to the target substrate 21.

At block S4, the magnetic layer covering the LED is removed from the LED.

The magnetic layer 221 may affect light emission from the LED 22, so the magnetic layer 221 should be removed from the LED 22.

As described above, a large number of LEDs 42 can be transferred onto the target substrate 41 at one time. Especially when the size of the LED 22 is small (such as mini LEDs and Micro LEDs), the above transferring system 20 improves manufacturing efficiency of the display panel.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An adsorption device, comprising:
a magnetic plate, a surface of the magnetic plate comprising a first region and a plurality of second regions spaced apart from each other, the first region and each of the plurality of second regions not overlapping with each other, the first region forming a magnetic pole of the magnetic plate, and each of the plurality of second regions forming a magnetic pole opposite to the magnetic pole of the first region; and
a limiting layer on the surface of the magnetic plate, the limiting layer covering the first region, each of the plurality of second regions being exposed to the limiting layer;
wherein each of the plurality of second regions is configured for adsorbing a target object;
wherein the limiting layer defines a plurality of through holes; each of the plurality of through holes aligns with a corresponding one of the plurality of second regions.

2. The adsorption device of claim 1, wherein the first region surrounds each of the plurality of second regions.

3. The adsorption device of claim 1, wherein each of the plurality of through holes is configured to receive the target object adsorbed by each of the plurality of second regions.

4. The adsorption device of claim 1, wherein each of the plurality of through holes has a cross-sectional area less than or equal to an area of the corresponding one of the plurality of second regions.

5. The adsorption device of claim 1, wherein the limiting layer is made of nonmagnetic material.

6. A transferring system, comprising:
a target substrate, a plurality of spots of anisotropic conductive adhesive being applied on the target substrate; and
an adsorption device, the adsorption device comprising:
a magnetic plate, a surface of the magnetic plate comprising a first region and a plurality of second regions spaced apart from each other, the first region and each of the plurality of second regions not overlapping with each other, the first region forming a magnetic pole of the magnetic plate, and each of the plurality of second regions forming a magnetic pole opposite to the magnetic pole of the first region; and
a limiting layer on the surface of the magnetic plate, the limiting layer covering the first region, each of the plurality of second regions being exposed to the limiting layer;
wherein each of the plurality of second regions is configured for adsorbing a target object;
wherein the limiting layer defines a plurality of through holes; each of the plurality of through holes aligns with a corresponding one of the plurality of second regions.

7. The transferring system of claim 6, wherein the first region surrounds each of the plurality of second regions.

8. The transferring system of claim 6, wherein each of the plurality of through holes is configured to receive the target object adsorbed by the corresponding one of the plurality of second regions.

9. The transferring system of claim 6, wherein each of the plurality of through holes has a cross-sectional area less than or equal to an area of the corresponding one of the plurality of second regions.

10. The transferring system of claim 6, wherein the limiting layer is made of nonmagnetic material.

* * * * *